United States Patent [19]

Bosnyak

[11] Patent Number: 4,625,162
[45] Date of Patent: Nov. 25, 1986

[54] FUSIBLE LINK SHORT DETECTOR WITH ARRAY OF REFERENCE FUSES

[75] Inventor: Robert J. Bosnyak, Mountain View, Calif.

[73] Assignee: Monolithic Memories, Inc., Santa Clara, Calif.

[21] Appl. No.: 663,806

[22] Filed: Oct. 22, 1984

[51] Int. Cl.[4] .................... G01R 31/02; G11C 29/00; G06F 11/00

[52] U.S. Cl. .................................. 324/51; 324/73 R; 371/21; 371/25

[58] Field of Search ........... 324/73 R, 73 PC, 73 AT, 324/51, 52; 371/21, 25, 15; 365/201, 96

[56] References Cited

U.S. PATENT DOCUMENTS 4,499,579  2/1985  Still et al. ............................... 371/15

OTHER PUBLICATIONS

Logue et al, Programmable Logic Array Error Detection nd Error Correction, Jul. 1976, IBM Technical Disclosure Bulletin, vol. 19, No. 2, pp. 588–590.

Primary Examiner—Reinhard J. Eisenzopf
Assistant Examiner—Jack B. Harvey
Attorney, Agent, or Firm—Alan H. MacPherson; Steven F. Caserza; Walter J. Madden, Jr.

[57] ABSTRACT

Circuitry is provided for testing fusible link arrays for short circuits around the fusible links. The resistance of each corresponding link in each of the four quandrants in the array is compared with the resistance of an array of reference fusible links to detect the presence or absence of a short circuit.

4 Claims, 4 Drawing Figures

FUSIBLE LINK SHORT DETECTOR WITH ARRAY OF REFERENCE FUSES

CROSS REFERENCE TO RELATED APPLICATIONS

Co-pending application Ser. No. 06/635,861, filed July 30, 1984 and assigned to the same assignee as the present application, discloses a short detector system for a fusible link array in which each fusible link is separately isolated and tested.

BACKGROUND OF THE INVENTION

1. Field of the Invention

This invention relates to the testing for short circuits in fusible link arrays which are used in Programmable Read Only Memories (PROM) and Programmable Array Logic, and the like.

2. Description of the Prior Art

In a typical array employing fusible links, a bit of information is represented by a fusible link, also called a "fuse". The presence or absence of a fuse determines the logical state of a bit. The device is manufactured with all fuses intact; that is, all bits in one logical state. The user of the device can choose the state of a bit by either leaving the fuse intact, or blowing the fuse (programming the bit) to create an open circuit (i.e. an absent fuse.) Ideally, all devices manufactured will have all their fuses intact before being packaged and sold, and when sold, every fuse the user wants to blow will, indeed, blow. In reality, of course, this is not the case. Some devices have fuses missing and some devices will have fuses that won't blow.

A missing fuse in the array is easy to detect, and is caught before the device is packaged. It is detected by checking the logical state on the output pin of the device. The logical state for a missing fuse will be opposite to that for an intact fuse. The device can be tested for any missing fuses at the wafer sorting level of the manufacturing process.

When a fuse is intact but refuses to blow, it is for one of several reasons. The fuse itself may be fatter or thicker than a normal fuse and therefore requires more power to blow; more indeed than the programmer can provide. It, therefore, remains intact when an attempt to program it is made. Also, metal particles can short out a fuse. For example, a small piece of metal can short from the emitter of the array transistor to the bit line. Metal can also short from the word line to the bit line. In both cases, the metal will not blow as a fuse will. The metal requires a great deal more power to melt and break down than the fuse material, and it prevents the fuse from blowing by providing an alternate path for the programming current. The fuse, therefore, remains intact. These are examples of what is defined collectively as a "fuse short".

In summary, a missing fuse can be found by detecting the wrong logical state at the output pin of the device. However, a fuse short will show the correct logical state on the output until an attempt is made to program it, at which time the output pin will still show the logical state of an intact fuse indicating that the fuse has failed to blow. The problem is that the device has been packaged and sold to the user before the fuse short is discovered, costing the manufacturer money, time and reputation.

SUMMARY OF THE PRESENT INVENTION

In the above identified co-pending application, each fusible link in the array is individually tested and the location of any fuse short can be determined. This testing of individual fuses is relatively time consuming and can add to the product cost as a result of the required test time. In accordance with the present invention, a configuration is provided which permits the simultaneous testing of a plurality of fuses in a fusible link array.

DESCRIPTION OF THE PREFERRED EMBODIMENT

Figure 1:
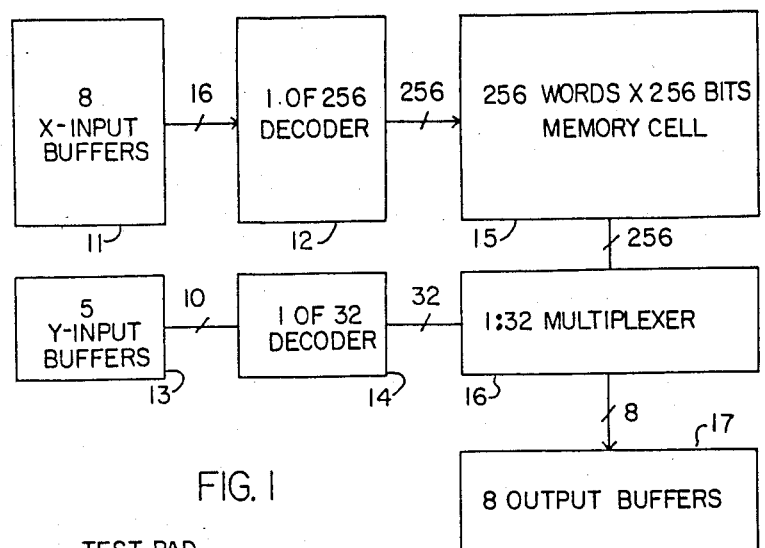
FIG. 1 is a block diagram of a typical bipolar PROM.

By way of background, the organization of a 64K PROM as shown in FIG. 1 is typical of most bipolar PROMs. There are 8 x-input buffers 11 which feed into a 1 of 256 decoder 12, which selects one word line in the memory cell array 15. The 5 y-input buffers 13 feed into a 1 of 32 decoder 14 which in turn feeds into a 256 line to 8 line multiplexer 16. This chooses 8 bit lines in the array. The multiplexer 16 feeds its 8 lines to eight output buffers 17, one line to one output.

Figure 2:
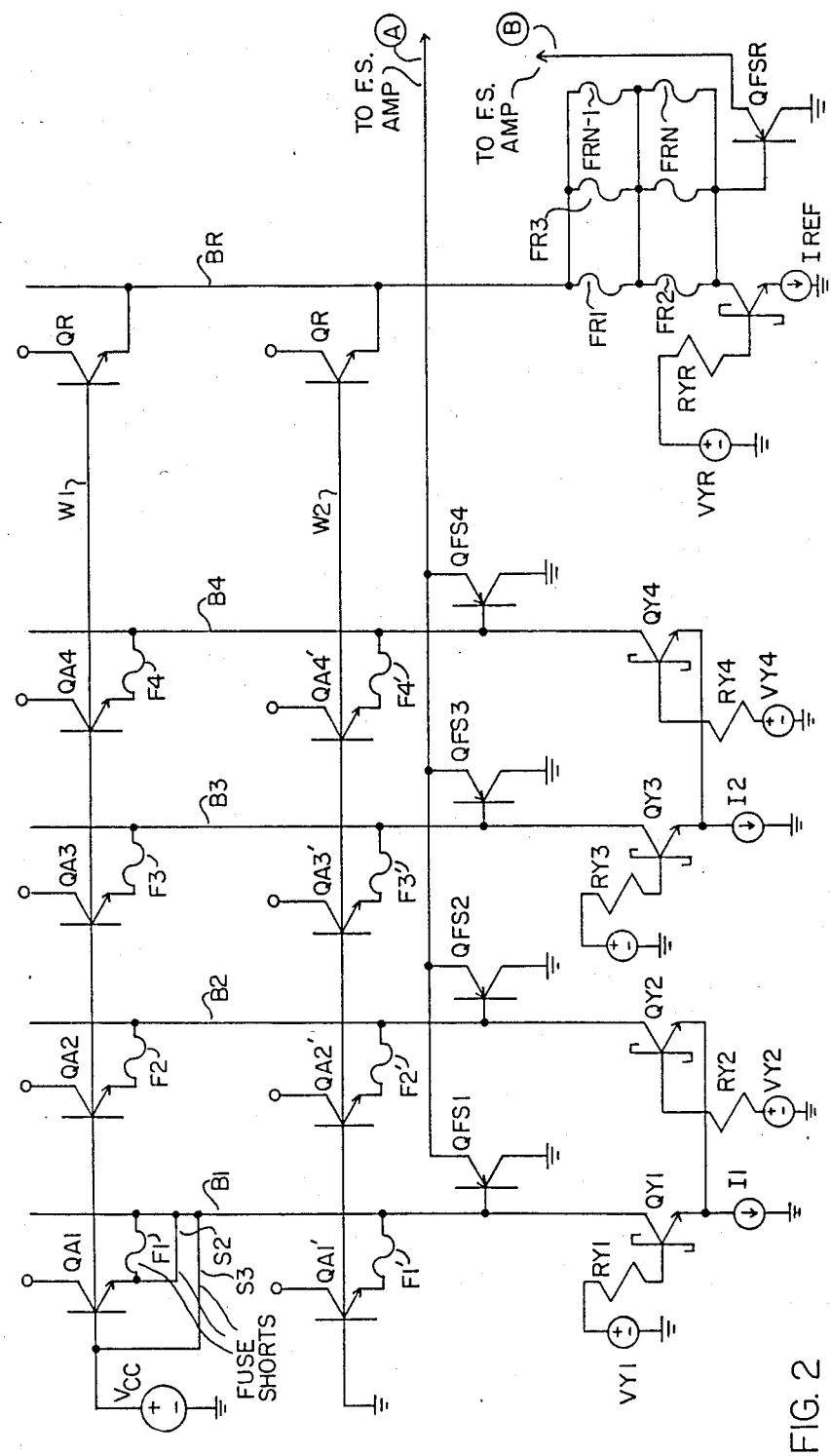
FIG. 2 is a circuit diagram showing the array and multiplexer of FIG. 1.

A simplified view of the array and multiplexing block of FIG. 1 is given in FIG. 2. Each output accesses 32 bit lines. In FIG. 2, B1 is the accessed bit line, and B2 represents the 31 unselected bit lines. QY1 is the multiplexer transistor which is on to select B1. QY2 represents the 31 multiplexer transistors which are off and thus not selecting the bit lines represented by B2. The emitters of QY1 and QY2 are common and are connected to I1, the sense amplifier current for one output. The sense amplifier detects the presence or absence of a fuse during normal operation and feeds this information to the output buffer. The bit line B3 represents the seven other bit lines that are selected and fed through seven QYs (here QY3) to the seven other sense amplifier outputs. B4 represents the 31 other bit lines for each output which is not selected.

W1 is the selected word line. W2 represents the 255 word lines not selected. QA1 is on and F1 represents the bit of information sensed by I1 and passed on to the output. QA2 represents the other 31 array transistors available to that output and are off because QY2 is off. QA3 represents the array transistors going to the other seven outputs. They are on and current flows through fuse F3 from QA3 to I2, which represents the sense amplifier currents for the other seven outputs. QA4 represents all the other array transistors not selected on W1. W2 represents the 255 word lines not selected, therefore QA'1–QA'4 are off.

The circuitry associated with the fuse short detection system operates as follows. QR is an array transistor on W1. QR' represents one array transistor on each of the remaining 255 word lines represented by W2. BR is the bit line connected to all the QRs. QYR is the multiplexer transistor on BR and IREF is the reference sense amplifier current. QFS1-QFS4 are vertical PNP transistors, one per bit line, and QFSR is an identical vertical PNP on the reference bit line BR. All the devices, resistors, etc. of the fuse shorts detection circuitry are designed to be as identical as possible to the corresponding devices in the array and multiplexer, because any mismatch between devices will degrade the performance of the invention.

Also shown in FIG. 2 are three possible modes of a fuse short condition in connection with fuse F1. In the first condition, the short is within fuse F1 itself, the result of the fuse being thicker or fatter than normal so that the programmed current will not blow it. A second potential short condition can be caused by a small piece of metal, represented by line S2, producing a short between the emitter of transistor QA1 and bit line B1. A third fuse short condition can occur if a piece of metal, represented by S3, results in a short between word line W1 and bit line B1.

The present invention is particularly adapted for use with arrays having four outputs and operates as follows: A plurality of reference fuses FR1, FR2, FR3, FRN are connected as shown in FIG. 2 to the BR line and the base of QFSR to form an array of reference fuses. The number of reference fuses FR employed in the array may be selected on the basis of statistical analysis relating to variations in the characteristics among the reference fuses as fabricated, but it appears that a number between 18-20 is appropriate. The resistance RFR of the total array of reference fuses is selected to be one-half the nominal resistance RF of one of the regular fuses such as F1.

To test the fuses in accordance with this invention, one fuse in each of the four quadrants of the array is selected through the appropriate bit and word lines to cause current to flow through each of the four selected fuses from their associated sense amplifiers. At the same time the fuse shorts circuitry (FIG. 3) has a suitable voltage, such as 10 V, applied to a test pad. This turns on the reference current source (represented by IREF in FIG. 2), this current IREF being designed to match as closely as possible the sense amplifier current sources on the outputs.

The present invention utilizes the very low resistance of a fuse short to detect a short. The operation is as follows: Referring to FIG. 2, first assume word line W1 in the first quadrant of the array is selected as well as bit line B1, and that the fuse shorts circuitry has been activated. Assume further that F1 is a normal fuse with normal resistance. The voltage at the base of QFS1, the vertical PNP, is:

$$VBQFS1 = VCL - VBEQA1 - I1RF \quad (1)$$

Where VBEQA1 is the base-to-emitter voltage of transistor QA1, VCL is a constant "clamp" voltage holding W1 at a predetermined voltage level and RF is the resistance of fuse F1.

As indicated above, the combined resistance of the array of reference fuses FR1-FRN is selected to be approximately one-half the resistance RF of a normal fuse. QR is designed to be identical to QA1. Therefore, the voltage at the base of QFSR, a vertical PNP identical to all the other QFS transistors is:

$$VBQFSR = VCL - VBEQR - IREF(\tfrac{1}{2} RF) \quad (2)$$

where $$VBEQR = VBEQA1$$

and $$IREF - I1$$

therefore:

$$VBQFSR = VCL - VBEQA1 - \tfrac{1}{2}(I1RF) \quad (3)$$

From the above equations, it can be seen that for an unshorted fuse the voltage on the base of QFS1 is lower than the voltage on the base of QFSR by $\tfrac{1}{2}(I1RF)$. This difference in voltage is fed to the output amplifier shown in FIG. 3, as will be described below.

Now assume that the fuse F1 is shorted in one of the ways described above. The resistance across the fuse, therefore, is much lower. This shorted resistance can be identified as RFS. The voltage at the base of QFS1 is now:

$$VBQFS1 = VCL - VBEQA - I1RFS \quad (4)$$

The voltage of the base of QFSR is still:

$$VBQFSR = VCL - VBEQA - \tfrac{1}{2}(I1RF) \quad (3)$$

Subtracting (3) from (4) we get:

$$VBQFS1 - VBQFSR = VCL - VBEQA1 - \\ I1RFS - (VCL - VBEQA1 - \tfrac{1}{2} I1RF) = \\ \tfrac{1}{2}I1RF - I1RFS = I1 (\tfrac{1}{2}RF - RFS) \quad (5)$$

The smaller the value of RFS the larger the difference between the voltages on the bases of QFS, QFSR, and the easier it is to detect the fuse short. Typically, RF is on the order of 80 ohms, and RFS is around 2 ohms, or about 2.5% of RF. This difference is fed to the output amplifier circuitry shown in FIG. 3.

Figure 3:
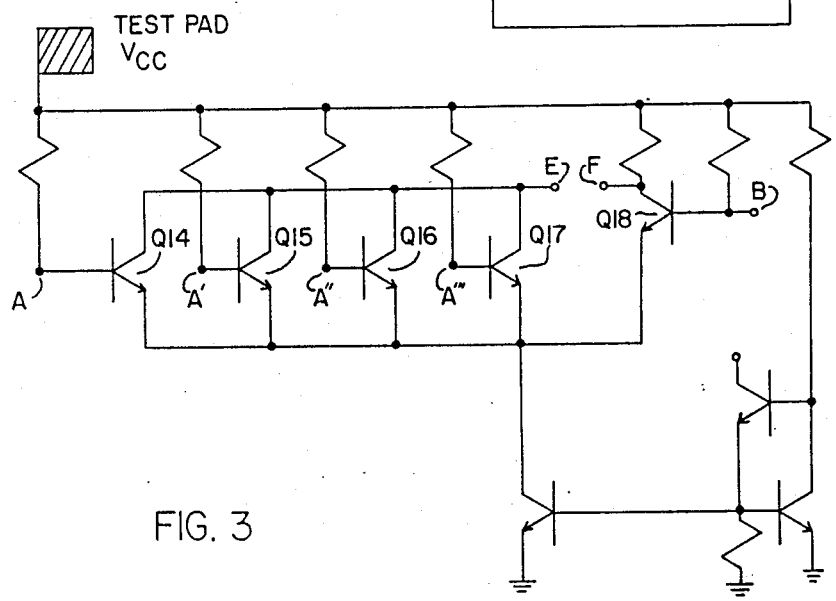
FIG. 3 is a circuit diagram showing differential amplifier detection circuitry for use with the circuitry of FIG. 2.

The voltage signals from the bit line being tested and from the reference bit line BR are fed to an output amplifier by way of the lines marked A and B in FIG. 2. In FIG. 3, the output signal on line A is supplied to the base of a transistor Q14. Similarly, the output signal on a line A', corresponding to the signal from the fuse under test in the second quadrant of the array, is supplied to the base of a transistor Q15. Correspondingly, signals on lines A" and A'", representing test signals from the fuses under test in the third and fourth quadrants, respectively, are supplied to the bases of transistors Q16 and Q17, respectively.

Figure 4:
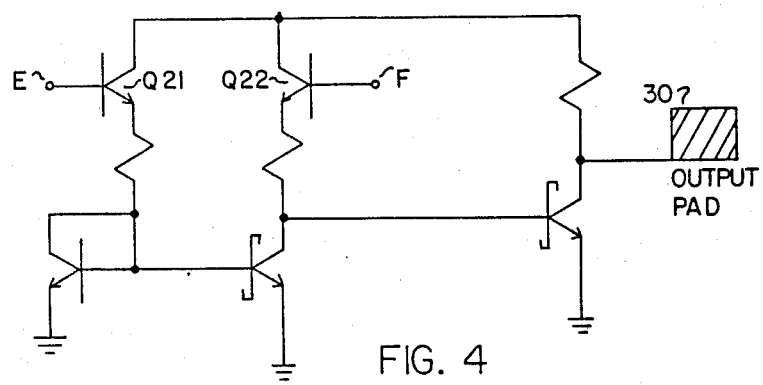
FIG. 4 shows a level shifting amplifier for receiving the outputs of the circuitry of FIG. 3 and which provides a shorts indicator.

The signal on line B is supplied to the base of a transistor Q18, transistors Q14-Q18 forming a differential amplifier producing outputs at terminals E and F. These outputs are supplied as inputs to the bases of transistors Q21, Q22 (FIG. 4) where the signals are amplified and level shifted and the difference supplied as a test result indicator to a test pad.

Thus, if each of the four tested fuses is not shorted, each of points A, A' A" and A'" will be lower than point B. However, if any one or more of the four tested fuses is shorted, its corresponding point A, A', A" and A'" will be at a higher level than point B. Through the amplifier circuitry of FIGS. 3 and 4, this level difference will result in the appearance of a low signal on test pad 30 which can be detected by the application thereto of a test probe.

Thus, the present invention is operable to simultaneously test four fuses for shorts, thereby increasing the testing speed in comparison with the sequential testing of individual fuses. Although the present system does not provide an indication of which of the tested fuses is shorted, this is not a disadvantage since any array with a shorted fuse would be discarded anyway.

I claim:

1. Circuitry for testing for short circuits in a fusible link array, said array having a plurality of quadrants of discrete fusible links each having a nominal resistance RF, any short circuit in one of said fusible links presenting a resistance which is substantially lower than RF, said circuitry comprising:

means for electrically isolating one of said fusible links in each of said quadrants from the other of said links;

an array comprising more than two reference fusible links, the total resistance of each reference fusible link array being approximately ½ RF;

means for simultaneously applying a voltage across one of said fusible links under test in each of said quadrants and across said array of reference fusible links; and means for comparing the voltage across each of said fusible links under test with the voltage across said array of reference fusible links to provide an indication of the presence or absence of a short circuit across one or more of said fusible links under test.

2. Circuitry for testing for short circuits in a fusible link array, said array having a plurality of quadrants of discrete fusible links, each fusible link having a nominal resistance RF, any short circuit in one of said fusible links presenting a resistance which is substantially lower than RF, said circuitry comprising:

means for electrically isolating one of said fusible links in each of said quadrants from the other of said links;

an array comprising more than two reference fusible links, the total resistance of said array of reference fusible links being approximately ½ RF;

a reference voltage circuit, said array of reference fusible links being connected in said reference voltage circuit;

means for simultaneously applying a voltage across one of said fusible links under test in each of said quadrants and across said array of reference fusible links; and means for detecting whether the voltage across any of said fusible links under test is larger or smaller than the voltage across said array of reference fusible links.

3. Circuitry in accordance with claim 2 in which said fusible links are arranged in an array having individually selectable orthogonal bit lines and word lines, the location of each of said fusible links being defined by the intersection of a bit line and a word line; and said means for electrically isolating one of said fusible links in each of said quadrants comprises means for selecting a given one of said bit lines and a given one of said word lines.

4. Circuitry in accordance with claim 3 including a voltage source;

a first transistor connected to said voltage source through a selected one of said fusible links in each of said quadrants;

a second transistor connected to said voltage source through said array of reference fusible links in each of said quadrants; and means for comparing the voltages across said first and second transistors in each of said quadrants to provide an indication of a short circuit across any one of said fusible links under test.

* * * * *